US011226373B2

(12) United States Patent
Sayegh

(10) Patent No.: US 11,226,373 B2
(45) Date of Patent: Jan. 18, 2022

(54) METHOD FOR DETERMINING A STATE NOISE COVARIANCE MATRIX FOR ADJUSTING AN OBSERVER OF THE STATE OF CHARGE OF A BATTERY AND CORRESPONDING DEVICE

(71) Applicant: ZODIAC AERO ELECTRIC, Montreuil (FR)

(72) Inventor: Marie Sayegh, Montreuil (FR)

(73) Assignee: SAFRAN ELECTRONICS & DEFENSE COCKPIT SOLUTIONS, Montreuil (FR)

( * ) Notice: Subject to any disclaimer, the term of this patent is extended or adjusted under 35 U.S.C. 154(b) by 132 days.

(21) Appl. No.: 16/513,538

(22) Filed: Jul. 16, 2019

(65) Prior Publication Data

US 2020/0025828 A1 Jan. 23, 2020

(30) Foreign Application Priority Data

Jul. 17, 2018 (FR) ...................................... 1856606

(51) Int. Cl.
*G01R 31/367* (2019.01)
*G01R 31/389* (2019.01)
*G01R 31/3842* (2019.01)

(52) U.S. Cl.
CPC ......... *G01R 31/367* (2019.01); *G01R 31/389* (2019.01); *G01R 31/3842* (2019.01)

(58) Field of Classification Search
CPC ........................... G01R 31/367; G01R 31/389; G01R 31/3842; G01R 31/3835; G01R 31/387

See application file for complete search history.

(56) References Cited

U.S. PATENT DOCUMENTS 10,838,010 B2\* 11/2020 Heiries ................ G01R 31/367
10,890,625 B2\* 1/2021 Kawai .................. G06F 30/367
(Continued)

FOREIGN PATENT DOCUMENTS

CN 105607009 B 5/2018

OTHER PUBLICATIONS

Preliminary Search Report, dated Mar. 29, 2019, issued in priority French Patent Application No. 1856606, filed Jul. 17, 2018, 16 pages (machine translation).

*Primary Examiner* — Mohammad K Islam
(74) *Attorney, Agent, or Firm* — Christensen O'Connor Johnson Kindness PLLC

(57) ABSTRACT

This method for determining a process noise covariance matrix for tuning an observer of the state-of-charge of a battery of electrical accumulators includes the steps of:
  determining, for each operating point of a set of operating points of the battery, a value of at least one component ($R_0$, $Z_1$) of an electrical model of the battery;
  obtaining, for each of said values, a determination error ($r(SOC_k)$) for said component;
  storing the values of said component and the determination errors;
  calculating the standard deviation ($\sigma[r(SOC_{1\ldots p})]$) for the determination errors for various operating points of the battery; and
  producing the covariance matrix (Q) on the basis of the calculated standard deviation.

10 Claims, 2 Drawing Sheets

(56) References Cited

U.S. PATENT DOCUMENTS

| | | | |
|---|---|---|---|
| 2004/0162683 A1* | 8/2004 | Verbrugge | G01R 31/3828 702/64 |
| 2005/0046388 A1* | 3/2005 | Tate, Jr. | G01R 31/367 320/132 |
| 2008/0054848 A1* | 3/2008 | Yun | G01R 31/367 320/134 |
| 2014/0244225 A1* | 8/2014 | Balasingam | G01R 31/3842 703/2 |
| 2014/0358459 A1* | 12/2014 | Trnka | G01R 31/389 702/63 |
| 2015/0231982 A1* | 8/2015 | Li | B60L 58/12 701/22 |
| 2015/0231985 A1* | 8/2015 | Li | B60L 58/13 320/134 |
| 2015/0231986 A1* | 8/2015 | Li | B60L 58/20 701/22 |
| 2015/0232083 A1* | 8/2015 | Yu | B60W 20/15 701/22 |
| 2015/0352972 A1* | 12/2015 | Li | H01M 10/482 701/22 |
| 2015/0377974 A1* | 12/2015 | Choi | G01R 31/367 702/63 |
| 2017/0356964 A1 | 12/2017 | Heiries et al. | |
| 2018/0045788 A1* | 2/2018 | Kawai | H01M 10/482 |
| 2020/0003841 A1* | 1/2020 | Lim | G01R 31/367 |
| 2021/0048480 A1* | 2/2021 | Lim | G01R 31/3842 |

\* cited by examiner

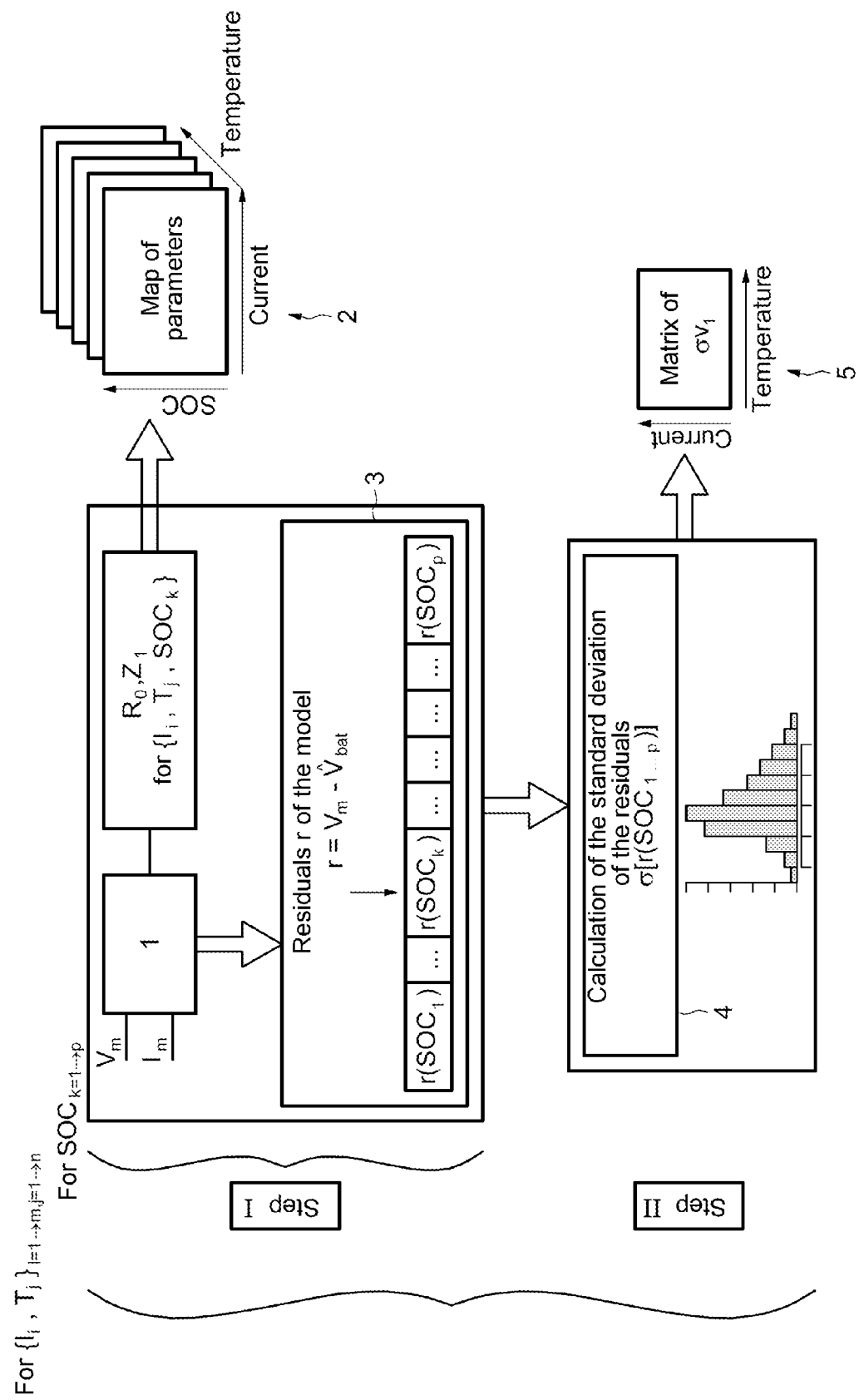

METHOD FOR DETERMINING A STATE NOISE COVARIANCE MATRIX FOR ADJUSTING AN OBSERVER OF THE STATE OF CHARGE OF A BATTERY AND CORRESPONDING DEVICE

CROSS-REFERENCE TO RELATED APPLICATIONS

The present application claims priority to French Patent Application No. 1856606, filed on Jul. 17, 2018, the content of which is incorporated herein by reference in its entirety.

FIELD OF INVENTION

The present invention relates to monitoring the operating state of batteries of electrical accumulators and, in particular, to monitoring the operating state of batteries on board an aircraft. More particularly, the invention relates to monitoring the state-of-charge, referred to as the SOC, of a battery of electrical accumulators.

BACKGROUND

Estimating the state-of-charge SOC is an essential part of managing electrical energy storage systems.

At present, there are various methods for determining the state-of-charge of a battery. However, improvements in the management of the electrical storage systems are still required.

SUMMARY

One of these methods consists in using a state-of-charge observer employing a Kalman filter in which the error between the measured voltage of the battery and the voltage estimated by the model is used to correct the states of the model of the battery via correction gain. The gain value is adjusted so as to regulate the dynamics of the observer.

This filter, which is also referred to as an extended Kalman filter (EKF) is based on a model describing the behaviour of the battery in the form of state equations.

The internal states of the model, in particular the state-of-charge SOC, are corrected so as to minimize the difference between the estimated voltage as output of the model and the voltage measured across the terminals of the battery.

Convergence between the behaviours of the model and of the battery is maintained thanks to a recursively computed dynamic corrective gain.

A Kalman filter uses error covariance P, process noise covariance Q and measurement noise covariance R matrices which act on the dynamics of the system.

The state-of-charge observer requires the initialization of the matrices P, R and Q.

The first matrix P calculates, upon each iteration, the error found in each of the state variables. This matrix is initialized on the basis of knowledge of the operating conditions or on the basis of worst-case initialization, corresponding to an initial error in the estimate of the SOC of 100%, being taken into account. The second matrix R is defined experimentally by quantifying the noise from the sensor by sampling the voltage of the battery measured in a rest phase.

Identifying the third matrix Q is the most critical task. This represents errors in the model and hence requires good knowledge and understanding of the model used.

Since the states of the observed system are not physically measurable, the matrix Q is defined empirically in the prior art, or even defined intuitively which affects the reliability of the methods of the prior art.

The object of the invention is therefore to overcome the drawbacks of the prior art and to provide a method for determining a process noise covariance matrix Q which takes the operating conditions of the battery into account.

Therefore, according to a first aspect, one subject of the invention is a method for determining a process noise covariance matrix for tuning an observer of the state-of-charge of a battery comprising a set of operating points.

This method includes:
- a step of determining, for each operating point, the value of the impedances of the electrical model of the battery;
- a step of calculating a difference in voltage between the voltage obtained by the electrical model, the impedances of which were determined upon completion of the determining step, and the voltage actually measured across the terminals of the battery;
- a step of storing the values of said impedances and of said voltage differences; and
- a step of producing the covariance matrix comprising standard deviations obtained on the basis of the voltage differences from the calculating step for various operating points of the battery.

Thus, the determination errors are obtained for each operating point of the set of operating points of the battery. These errors are therefore not fixed but instead depend on the operating conditions of the battery.

According to another feature, the values of the impedances are determined from the voltage across the terminals of the battery and from the current going through the battery.

According to yet another feature, the values of the impedances are determined using the method of least squares.

For example, the impedances of the electrical model of the battery comprise a resistance and an impedance of the battery.

Advantageously, the values of said impedances are stored according to the state-of-charge of the battery, the current crossing the battery and the temperature of the battery.

According to yet another feature of the method, the voltage differences are stored for each state-of-charge.

The voltage differences are advantageously obtained according to the temperature and the current crossing the battery.

In one embodiment, the voltage differences are obtained on the basis of a difference between a measured value of the voltage across the terminals of the battery and an estimated value of said voltage.

In one advantageous implementation, the observer is an extended Kalman filter.

Another subject of the invention, according to another aspect, is a device for determining the state-of-charge of a battery of electrical accumulators, comprising an observer of the state-of-charge of the battery, a memory in which the value of the impedances of an electrical model of the battery are stored for each operating point of the battery, means for calculating a difference in voltage between a voltage obtained by the electrical model, the impedances of which have been stored, and the voltage actually measured across the terminals of the battery, and means for producing the covariance matrix, said matrix comprising standard deviations obtained on the basis of the voltage difference calculated for various operating points of the battery.

DESCRIPTION OF THE DRAWINGS

Other objects, features and advantages of the invention will become apparent on reading the following description, which is given solely by way of nonlimiting example and with reference to the appended drawings, in which:

FIG. 2 illustrates the main steps of a method for determining a process noise covariance matrix.

DETAILED DESCRIPTION

Figure 1:
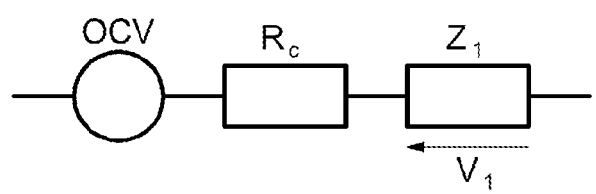
FIG. 1 illustrates an electrical model of a battery.

With reference to FIG. 1, a battery, and in particular a battery on board an aircraft, may be modelled in the form of an electrical model comprising a voltage source OCV, representing the open circuit voltage of the battery, a resistance $R_0$ and an impedance $Z_1$, describing the static behaviour and the dynamic behaviour of the battery, respectively.

The output voltage of the battery may be expressed on the basis of the components of this electrical model and the current of the battery.

Thus, the internal state variables of this model are the state-of-charge SOC and the voltage $V_1$ across the terminals of the impedance $Z_1$. The noises on the states are assumed to obey normal distributions. They are white, Gaussian and centred.

Under these conditions, the process noise covariance matrix Q, which represents the errors in the components of the electrical model, is written as:

$$Q = \begin{bmatrix} (\sigma V_1)^2 & 0 \\ 0 & (\sigma_{SOC})^2 \end{bmatrix}$$

where: $(\sigma V_1)^2$ and $(\sigma_{SOC})^2$ denote the error variances in the estimate of the state $V_1$ and SOC quantities, respectively.

The parameter $\sigma_{SOC}$ characterizes the uncertainty in the state-of-charge SOC. This parameter affects the speed of convergence of the estimated state-of-charge on the actual state-of-charge and the uncertainty in the estimate. Thus, for example, when the parameter $\sigma_{SOC}$ is large, convergence on the actual SOC is fast at the cost of increased uncertainty.

Since determining the value of this parameter relates to the final application rather than to the electrical model of the battery, this parameter is determined empirically by the user.

It is thus assumed that the modelling errors occur only in the identification of the parameter $\sigma_{v1}$.

The method for determining the matrix Q thus consists in producing a covariance matrix on the basis of the standard deviation of the errors between the measured voltage and the predicted voltage for various operating points of the battery.

The model of the battery is thus characterized by a characterization matrix comprising m current regimes, n temperatures and p tested state-of-charge values.

Thus, with reference to FIG. 2, in a first phase I, a phase of testing the battery, allowing the values of components $R_0$ and $Z_1$ for each operating point defined by the current, temperature and state-of-charge values $I_i$, $T_j$, $SOC_k$ to be obtained, is carried out. A test protocol is thus repeated for each operating point.

On the basis of a voltage value Vm and current value Im, values of the components $R_0$ and $Z_1$ are determined by identifying a transfer function using the method of least squares (step 1) and the results obtained are saved in matrices according to the state-of-charge SOC, the current and the temperature.

Upon completion of this prior test phase, the components of the electrical model of the battery are stored in a map for all of the operating points, i.e. for all of the states of charge $SOC_{k=1,\ldots,p}$, at a given current $I_i$ and a given temperature $T_j$ (step 2).

In parallel, the errors resulting from the identification, called residual errors $r(SOC_k)$, which are found between the measured voltage Vm and the voltage predicted by the model $\hat{V}_{bat}$, are saved for each $SOC_k$ tested (step 3).

Next, the method goes from the following phase II to actually producing the matrix Q.

As mentioned above, the state-of-charge SOC is the state quantity to be observed. Its influence on the parameters of the model is the smallest in relation to that of the temperature and of the current. The dependence of the errors on this state quantity can thus be negligible. Additionally, estimating the resistance $R_0$ is generally more straightforward and more accurate than estimating the impedance $Z_1$.

Consequently, it is assumed that the error found between the measured output voltage and the predicted voltage is mainly due to the voltage $V_1$.

The value of the parameter $\sigma_{V1}$ is then determined by calculating the standard deviation of the residuals $\sigma[r(SOC_{1\ldots p})]$ obtained between the measured voltage and the predicted voltage (step 4). It is then tabulated in a matrix for each operating point defined by a temperature value and a current value (step 5).

A process noise covariance matrix Q that is dependent on the operating conditions of the battery is thus obtained.

The new matrix Q is written as:

$$Q = \begin{bmatrix} (\sigma V_1(I,T))^2 & 0 \\ 0 & (\sigma_{SOC})^2 \end{bmatrix}$$

where $\sigma V_1$ is expressed as a function of the current I and of the temperature T.

Thus, the method described above makes it possible to determine the matrix Q within the operational ranges of the envisaged application, above all at extreme temperature (low temperature) and current (large current) limits.

Furthermore, the invention described above is based on a particularly simple battery electrical model. This method is however not limited to such an electrical model and could be adapted for more complex electrical models.

For example, when using an electrical model comprising an increased number of electrical modelling components, the voltages across the terminals of these components constitute components of the model which are added to the basic model. Thus, in step 3 of phase 1 described above, the residuals are calculated between the measured voltage and the predicted voltage for each of the electrical modelling components. The voltage error between the measurement and the prediction is thus distributed over the various state quantities.

Furthermore, the impedance $Z_1$ may in practice be modelled in various forms, for example by a series of RC circuits, using a resistor and a capacitor.

The type of model could also be changed, for example an electrochemical model could be used, without departing from the scope of the invention.

Figure 3:
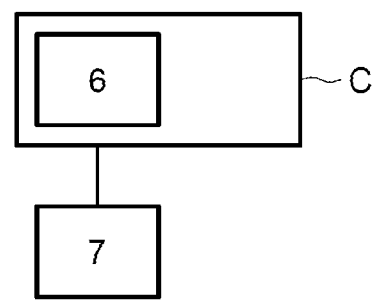
FIG. 3 is a block diagram implementing the method of FIG. 2.

With reference to FIG. 3, the method described above may be implemented by means of a device, shown schematically, comprising a computer C incorporating an observer 6 of the state-of-charge of the battery, in this instance an extended Kalman filter, in combination with a memory 7 storing values of at least one component of an electrical model of the battery, in this instance resistance and impedance values, obtained in a prior test phase, for each operating point of the battery, and errors in determining these components, the computer being suitably programmed to calculate the standard deviation of said errors during the use of the battery, according to the temperature and the current, in order to produce the matrix Q for the Kalman filter 6.

The invention claimed is:

1. A method for determining a process noise covariance matrix for tuning an observer of a state-of-charge of a battery comprising a set of operating points, wherein the method comprises: —a step of determining, for each operating point, a value of impedances (Ro, Z1) of an electrical model of the battery; —a step of calculating a voltage difference, $r(SOC)_k$, between a voltage obtained by the electrical model, the impedances of which were determined upon completion of the determining step, and a voltage actually measured across the terminals of the battery; —a step of storing the values of said impedances and of said voltage differences; and—a step of producing the covariance matrix (Q) comprising standard deviations, $\sigma[r(SOC_{1...p})]$, obtained based on the voltage differences from the calculating step for various operating points of the battery.

2. The method of claim 1, wherein the values of the impedances are determined from the voltage across the terminals of the battery and from a current through the battery.

3. The method of claim 2, wherein the values of the impedances are determined using a method of least squares.

4. The method of claim 1, wherein the impedances of the electrical model comprise a resistance ($R_0$) and an impedance ($Z_1$) of the battery.

5. The method of claim 1, wherein the values of said impedances are stored according to the state-of-charge of the battery (SOC), a current (I) through the battery and a temperature (T) of the battery.

6. The method of claim 1, wherein the voltage differences are stored for each state-of-charge.

7. The method of claim 6, wherein the voltage differences are obtained according to a temperature and a current through the battery.

8. The method of claim 1, wherein the voltage differences are obtained based on a difference between a measured value Vm of the voltage across the terminals of the battery and an estimated value $\hat{V}_{bat}$ the voltage.

9. The method of claim 8, wherein the state-of-charge observer is an extended Kalman filter.

10. A device for determining a state-of-charge of a battery, comprising: an observer of a state-of-charge e of the battery, a memory in which the value of impedances of an electrical model of the battery are stored for each operating point of the battery, and a computer with a memory, the computer being configured for: calculating a difference in voltage, $r(SOC)_k$, between a voltage obtained by an electrical model, the impedances of which have been stored, and a voltage actually measured across terminals of the battery, and producing a covariance matrix (Q), said matrix comprising standard deviations, $\sigma[r(SOC_{1...p})]$, obtained based on the voltage difference calculated for various operating points of the battery.

* * * * *